(12) United States Patent
Shen

(10) Patent No.: US 10,547,308 B2
(45) Date of Patent: Jan. 28, 2020

(54) RECONFIGURABLE LOW POWER AND LOW AREA GATE BOOTSRAPPING CIRCUIT

(71) Applicant: Analog Devices, Inc., Norwood, MA (US)

(72) Inventor: Junhua Shen, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/166,858

(22) Filed: Oct. 22, 2018

(65) Prior Publication Data

US 2019/0158087 A1     May 23, 2019

Related U.S. Application Data

(60) Provisional application No. 62/589,897, filed on Nov. 22, 2017.

(51) Int. Cl.
*H03M 1/12*     (2006.01)
*H03K 17/687*   (2006.01)
*H03M 1/00*     (2006.01)

(52) U.S. Cl.
CPC ........ *H03K 17/687* (2013.01); *H03M 1/1245* (2013.01); *H03M 1/001* (2013.01)

(58) Field of Classification Search
CPC ... H03M 1/1245; H03M 1/101; H03K 17/687
USPC ......................... 341/144, 155, 161, 122, 172
See application file for complete search history.

(56) References Cited

U.S. PATENT DOCUMENTS

| | | | |
|---|---|---|---|
| 6,020,769 A | 2/2000 | Vallancourt | |
| 6,118,326 A | 9/2000 | Singer et al. | |
| 6,724,239 B2 | 4/2004 | Price et al. | |
| 8,232,904 B2 * | 7/2012 | Lee | G11C 27/024 341/155 |
| 8,581,636 B2 | 11/2013 | Mateman | |
| 8,866,652 B2 * | 10/2014 | Singer | H03M 1/1245 327/296 |
| 9,484,905 B1 | 11/2016 | Mai et al. | |
| 2003/0206038 A1 * | 11/2003 | Mueck | H03K 5/249 327/50 |
| 2008/0122812 A1 * | 5/2008 | Park | G09G 3/3648 345/204 |

OTHER PUBLICATIONS

Abo, Andrew M., "A 1.5-V, 10-bit, 14.3-MS s CMOS Pipeline Analog-to-Digital Converter", IEEE Journal of Solid-State Circuits, 34(5), (May 1999), 599-606.

* cited by examiner

*Primary Examiner* — Peguy Jean Pierre
(74) *Attorney, Agent, or Firm* — Schwegman Lundberg & Woessner, P.A.

(57) ABSTRACT

A sampling circuit comprises a switch circuit and a gate bootstrapping circuit. The switch circuit includes a switch input to receive an input voltage, a gate input, and a switch output. The gate bootstrapping circuit provides a boosted clock signal to the gate input of the switch circuit. The boosted voltage of the boosted clock signal tracks the input voltage by a voltage offset. The gate bootstrapping circuit includes a single boost capacitance coupled between a first circuit node and a second circuit node. A high supply voltage is applied to the first circuit node and the input voltage is applied the second circuit node to generate the boosted voltage on the single boost capacitance.

18 Claims, 4 Drawing Sheets

US 10,547,308 B2

RECONFIGURABLE LOW POWER AND LOW AREA GATE BOOTSRAPPING CIRCUIT

CLAIM OF PRIORITY

This application claims the benefit of priority under 35 U.S.C. § 119(e) of U.S. Provisional Patent Application Ser. No. 62/589,897, filed on Nov. 22, 2017, which is herein incorporated by reference in its entirety.

BACKGROUND

Signal acquisition can be an important step for discrete time signal processing. The integrity of the signal acquired often limits the overall circuit performance of discrete time signal conditioning circuits, analog-to-digital converters, switch cap filters, etc. FIG. 1A is a circuit diagram of a basic switched capacitor (or switched cap) sampling circuit 105, in which the switch is a transmission gate (T-gate) that accommodates input signals from rail to rail. The T-gate includes an n-type metal oxide semiconductor (NMOS) transistor 102 and a p-type metal oxide semiconductor (PMOS) transistor 104. The capacitor represents the load to the T-gate and the signal Q is the sampling clock signal. FIG. 1B is an illustration of the ON impedance $R_{ON}$ of the T-gate in FIG. 1A. Ideally $R_{ON}$ is small and the variation with input voltage VIN is as flat as possible so that the sampled signal has minimal distortion. In practice, the T-gate $R_{ON}$ is much higher when the input signal VIN is right at midrange between a low VIN and a high VIN, where both the PMOS and NMOS transistors are barely turned on due to the relatively large threshold voltage $V_{TH}$. This is especially true when the supply voltage is low as in advanced complementary metal oxide semiconductor (CMOS) technologies. Thus there is a need for improved performance of sampling circuits.

OVERVIEW

This document relates generally to sampling circuits for discrete time signal processing of electronic signals. A sampling circuit example includes a switch circuit and a gate bootstrapping circuit. The switch circuit includes a switch input to receive an input voltage, a gate input, and a switch output. The gate bootstrapping circuit provides a boosted clock signal to the gate input of the switch circuit. The boosted voltage of the boosted clock signal tracks the input voltage by a voltage offset. The gate bootstrapping circuit includes a single boost capacitance coupled between a first circuit node and a second circuit node. A high supply voltage is applied to the first circuit node and the input voltage is applied the second circuit node to generate the boosted voltage on the single boost capacitance.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 2:
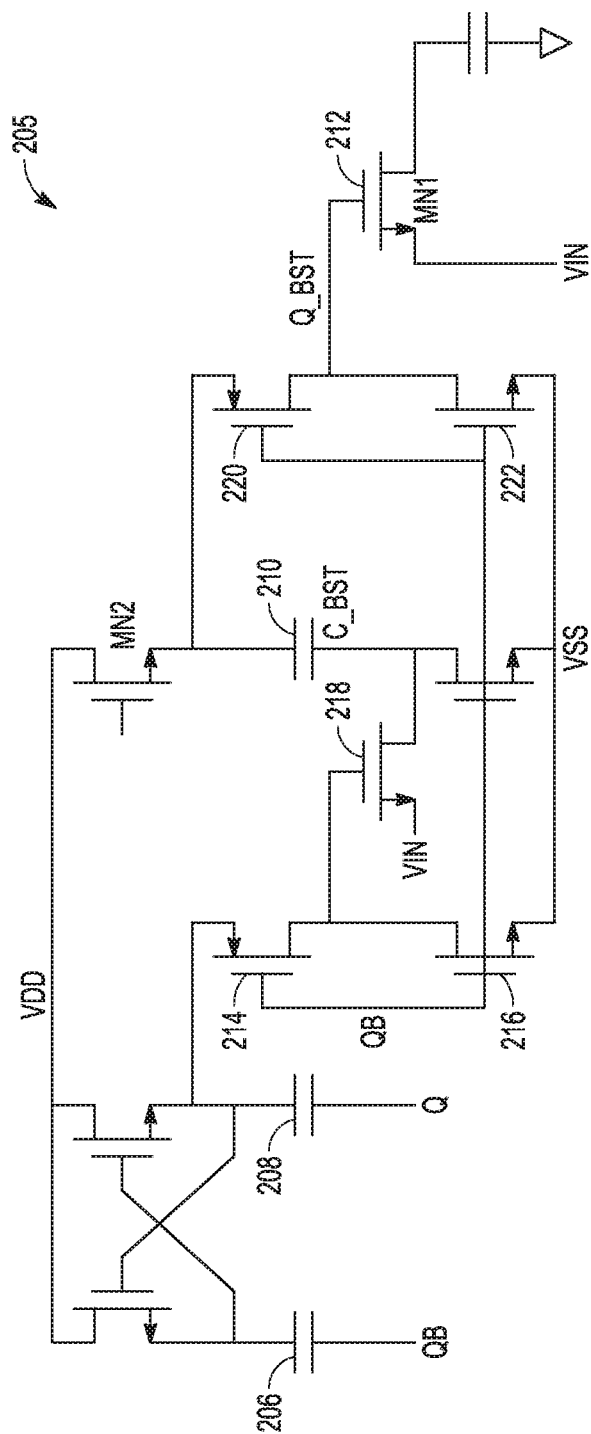
FIG. 2 is a circuit diagram of an example of a sampling circuit.

As explained previously herein, the ON impedance of sampling circuits is not ideal. FIG. 2 is a circuit diagram of an example of a sampling circuit that makes the ON impedance $R_{ON}$ for a switch flatter over the range of the expected input voltage. The sampling circuit 205 includes three booster capacitors 206, 208, and 210. A clock signal Q and an inverted clock signal QB are provided to two of the booster capacitors. The input voltage VIN is combined with the clock signals using capacitor 210 to create boosted voltage Q-BST. The boosted voltage drives the gate of NMOS sampling switch 212 (MN1). Because of the boosted voltage, transistors 214, 216, 218, 220, and 222 are higher voltage, thick gate devices as indicated in the Figure by the darker line for the gates of the transistors.

Figure 1A:
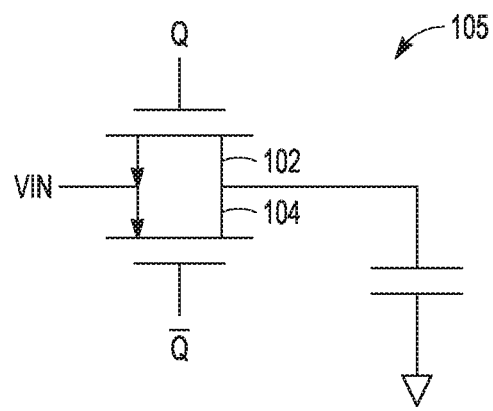
FIG. 1A is a circuit diagram of a basic switched capacitor sampling circuit.
Figure 1B:
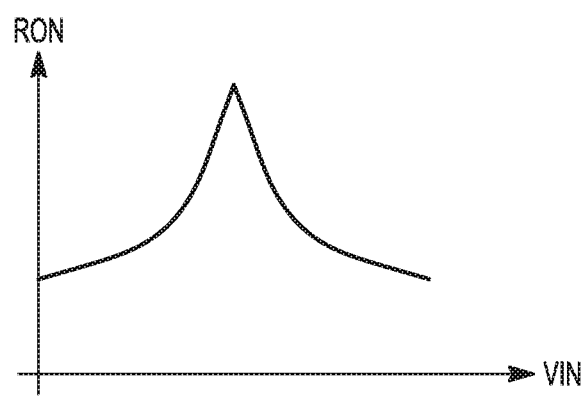
FIG. 1B is an illustration of the ON impedance of the transmission gate of FIG. 1A.
Figure 3:
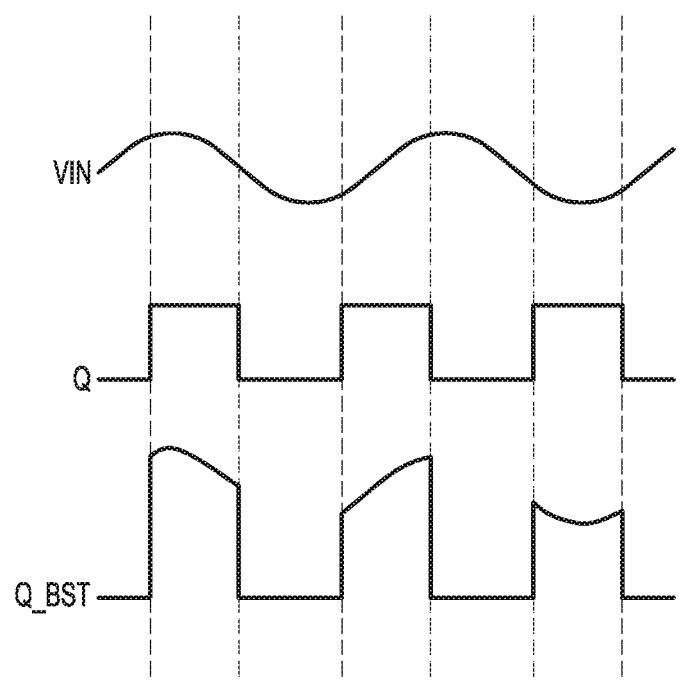
FIG. 3 is an illustration of the waveforms associated with operation of the sampling circuit of FIG. 2.

FIG. 3 is an illustration of the waveforms associated with operation of the sampling circuit of FIG. 2. It can be seen in FIG. 3 that the boosted clock Q_BST is largely tracking the input signal VIN. For this reason, the sampling switch MN1 of the circuit in FIG. 2 has a stable gate-source voltage regardless of the value of the input voltage VIN. The stable gate-source voltage makes $R_{ON}$ relatively constant. Though the circuit 205 of FIG. 2 provides significant improvement in acquisition linearity over the circuit of FIG. 1A, it is power and area hungry due to the three booster capacitors and due to the several parasitic circuit effects associated with the thick gate devices.

Figure 4:
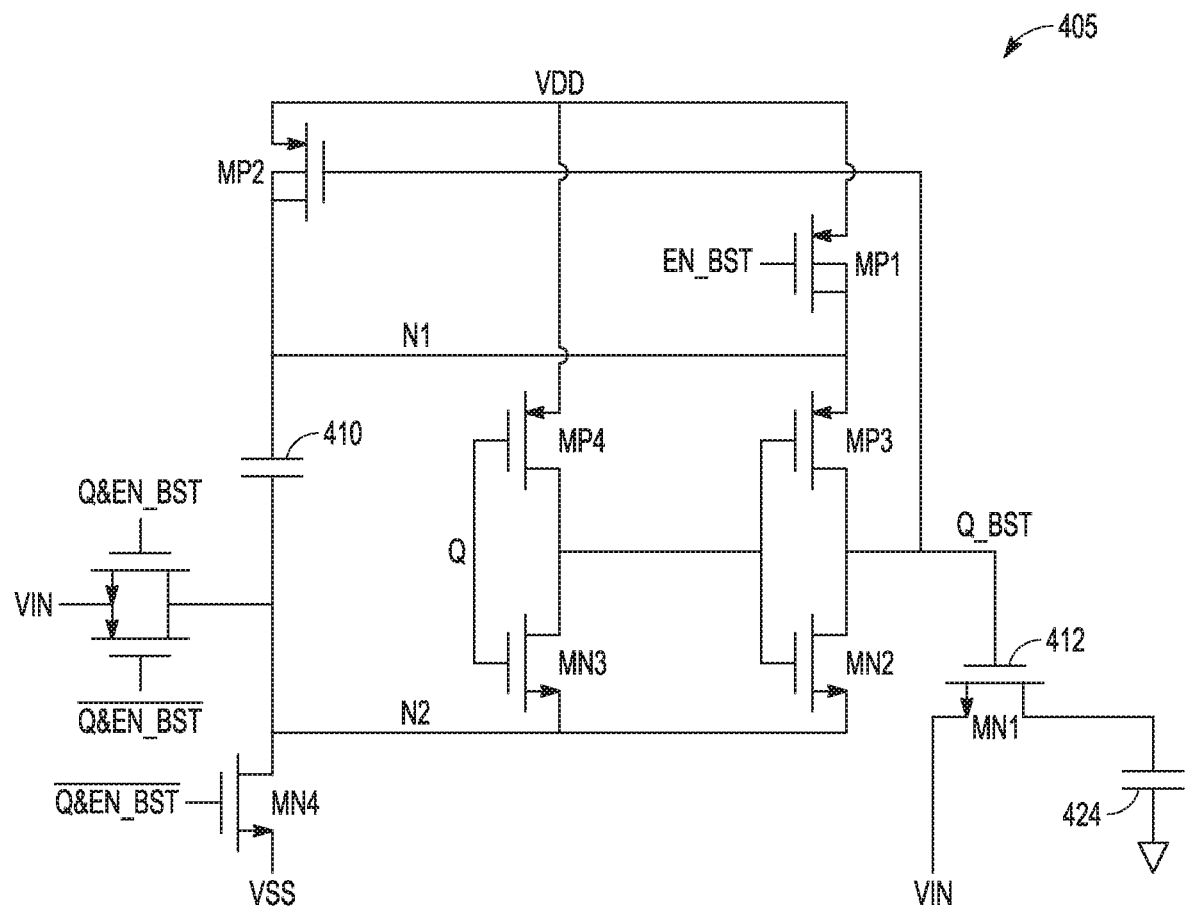
FIG. 4 is a circuit diagram of another example of a sampling circuit.

FIG. 4 is a circuit diagram of an example of an improved approach for a sampling circuit 405. The sampling circuit 405 includes a switch circuit 412 and a gate bootstrapping circuit. The switch circuit 412 includes a switch input to receive the input voltage VIN, a gate input, and a switch output that is connected to a load shown as capacitance 424. The switch circuit 412 and the capacitance 424 may be included in a switched cap circuit. The gate bootstrapping circuit provides a boosted clock signal Q_BST to the gate input of the switch circuit 412. The operation of the circuit follows the waveforms of FIG. 3. The boosted voltage of the boosted clock signal tracks the input voltage VIN by an offset voltage. Ideally, the boosted voltage of the boosted clock signal is offset from the input voltage VIN by the higher supply voltage VDD, but in practice the voltage offset will be lower than VDD due to parasitic effects.

The gate bootstrapping circuit includes a single boost capacitance 410 coupled between a first circuit node N1 and a second circuit node N2, instead of the three separate booster capacitors in the approach of the example in FIG. 2. The single boost capacitance 410 may include one capacitor or multiple unit size capacitors coupled together to form the single boost capacitance. The high supply voltage (VDD) is applied to the N1 circuit node and VIN is applied to the N2 circuit node to generate the boosted voltage on the single boost capacitance.

In contrast, the circuit approach in FIG. 2 uses three booster capacitors 206, 208, 210 to generate a boosted clock to turn on NMOS transistor MN2 when Q is low in FIG. 3. Also, the voltage of a non-boosted clock signal (Q or QB) is not applied to the boost capacitance 410 in FIG. 4 to generate the boosted voltage. In FIG. 4, the gate bootstrapping circuit output clock Q_BST is used to control the PMOS transistor (MP2) connected to the top of the boost capacitance 410. Transistor MP2 is a switch that replaces the NMOS transistor MN2 in FIG. 2. In FIG. 4, the transistor body of MP2 is connected to circuit node N1 instead of the high supply voltage VDD. In this configuration, Q_BST is low during the non-boosting phase when Q is low, and circuit node N1 will be charged up to VDD to be ready for the next acquisition or boosting phase when Q is high in FIG. 3. During the subsequent acquisition phase, the voltage of N1 will be boosted up by the amount of VIN. Transistor MP2 is not overstressed because its gate is also boosted up. Also, there is no transistor body leakage for MP2 because the transistor body (the transistor n-well) is tied to N1, which is a boosted voltage circuit node.

The gate bootstrapping circuit in FIG. 4 includes a buffer circuit that comprises a first inverter and a second inverter. The first inverter includes transistors MP4 and MN3 and is coupled between the high supply voltage VDD and circuit node N2. The second inverter includes transistors MP3 and MN2 and is coupled between circuit node N1 and circuit node N2. The first inverter receives the unboosted clock signal Q at its input and the second inverter outputs the boosted clock signal Q_BST.

Instead of being connected to ground (VSS) as are transistors 216 and 222 in FIG. 2, both transistors MN2 and MN3 of FIG. 4 are connected to circuit node N2, the bottom of the boost capacitance 410. Thus during the boosting phase, MN2 won't be overstressed because the drain-source voltage (Vds) of MN2 won't exceed VDD, MP3 of the second inverter is also not overstressed because its gate input is at VIN, so the gate-source voltage Vgs or gate-drain voltage |Vgd| of MP3 won't exceed VDD either. Because the devices won't be overstressed, low voltage devices can be used for transistors MP4, MN3, MP3, and MN2, instead of the higher voltage thick gate devices 214, 216, 220 and 222 of FIG. 2, to significantly reduce parasitic capacitance and thus reduce power consumption.

The thick gate device 218 switch for VIN of FIG. 2 also is not needed, and low voltage device T-gate 418 can be used for VIN for FIG. 4. This is because the gate control of T-gate 418 is not boosted as the accuracy of the boost capacitance 410 bottom plate voltage (circuit node N2) isn't critical to the first order. The gate control can be provided by the unboosted clock signal Q and the T-gate 418 is not overstressed and low voltage devices can be used for T-gate 418. Alternatively, the boosted clock signal Q_BST could be used in place of Q to control the NMOS switch that connects VIN and the bottom plate of boost capacitance 410.

The sampling circuit 405 of FIG. 4 sacrifices some uniformity of the impedance $R_{ON}$ of the switch circuit 412, but the circuit consumes much smaller area and power than the approach of FIG. 2, which can be critical for many applications.

The clock mode of the gate bootstrapping circuit is reconfigurable with minimal circuit overhead. According to some embodiments, the gate bootstrapping circuit includes an enable input to receive an enable signal EN_BST. The gate bootstrapping circuit provides either the boosted clock signal or an unboosted clock signal to the gate input of the switch circuit 412 according to the state of the enable signal.

In FIG. 4, PMOS transistor MP1 is coupled to the high supply voltage VDD and circuit node N1. The gate of MP1 is coupled to the enable signal to enable/disable the boost clock mode as needed. In certain embodiments, transistor MP1 is a high threshold device to prevent leakage at circuit node N1 in the boosted clock mode.

The T-gate 418 can be controlled using the enable signal EN_BST and the unboosted clock signal Q. The T-gate 418 provides VIN to circuit node N2 (and the bottom of boost capacitance 410) when the enable signal is active and the gate bootstrapping circuit is in the boosted clock mode. Transistor MN4 is coupled between circuit node N2 and the low supply voltage VSS, and the gate of MN4 is connected to the inverse of the logic AND of the enable signal and the unboosted clock signal, and MN4 is always ON in the unboosted clock mode. When the enable signal is inactive, the T-gate 418 that connects to VIN is disabled and transistor MN4 is ON to provide VSS to circuit node N2.

This reconfigurability is provided with negligible circuit overhead and allows the user to choose the boosted clock mode or a normal unboosted clock mode for sampling. This is desirable in circuits such as analog-to-digital converters (ADCs) where both continuous and impulse operations may be used. In the continuous mode, the user may choose the boosted clock to improve acquisition linearity with higher frequency input. In the impulse mode, where the ADC may stay in passive acquisition for an extended time before next conversion takes place, only normal clock mode is allowed; otherwise Q_BST in FIG. 2 may leak towards ground during passive acquisition.

Figure 5:
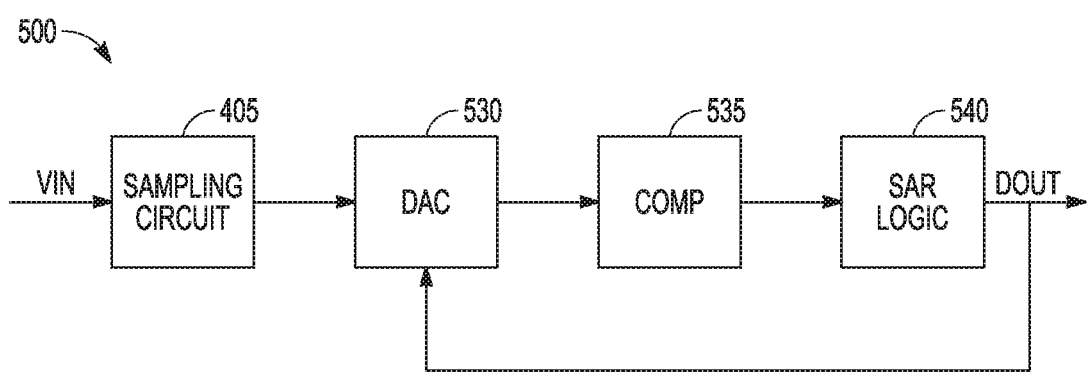
FIG. 5 is a functional block diagram of an example of a successive approximation analog-to-digital converter.

FIG. 5 is a functional block diagram of an example of a successive approximation analog-to-digital converter (SAR ADC) 500. The SAR ADC includes a sampling circuit 405, a digital-to-analog converter (DAC) circuit 530 operatively coupled to the sampling circuit 405, a comparator circuit 535, and logic circuitry 540. The sampling circuit 405 can be a sampling circuit as shown in FIG. 4 and can include a switch circuit and a gate bootstrapping circuit.

In the example of FIG. 5, an input voltage VIN is sampled using sampling circuit 405. A differential output voltage of a DAC circuit 530 is compared to the sampled voltage using comparator circuit 535. The bit values of the DAC circuit 530 are adjusted based on the output of the comparator circuit. The conversion may start with the DAC set to midscale. The comparator circuit 535 determines whether the DAC output is greater or less than a specified threshold voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. Logic circuitry 540 controls the ADC operation during the bit trials. When the bit trials are complete, the digital value of the sampled and held voltage is available at output $D_{OUT}$.

The sampling circuit can include an enable input to enable boost mode. The sampling circuit operates in a boost mode when the ADC circuit operates in a continuous mode and the enable signal is active. The sampling circuit operates in a normal unboosted mode when the ADC operates in an impulse mode and the enable signal is inactive.

In general, the sampling circuit approach of FIG. 4 occupies around ⅓ of the area compared to the approach of FIG. 2. Only one boosting capacitance is used, and the boosting capacitance can be considerably smaller than the boosting capacitors of FIG. 2 because the parasitics associated with the low voltage devices of FIG. 4 are much smaller, reducing the load on the boosting capacitor. Similarly, by simplifying the circuit and using low voltage devices, the dynamic power consumption is reduced proportionally over the dynamic power of the approach of FIG. 2. Also, the drivability of the gate bootstrapping circuit is improved because transistors MN2 and MP3 are low voltage devices rather than thick gate input/output IO devices.

On the downside, the sampling circuit in FIG. 4 is mostly robust, but when dealing with an input signal that is very close to the Nyquist rate, care needs to be taken regarding potential transient glitches that may briefly exceed Vgs/d limits for low voltage devices. For example, during the boosting phase, if VIN goes up suddenly, the bottom plate of the boost capacitance 410 (circuit node N2) will go up, and thus circuit node N1 will go up (attenuated though). The gate input of MP3 should increase quickly enough, following the change at N2 (MN3 is ON in boosting phase), to ensure that the Vgs of MP3 is not stressed. Another potential drawback is that the boosted voltage Q_BST may not track VIN as well as in the approach of FIG. 2 because it may be desirable to limit the voltage at circuit node N1 during the boosting phase so that transistor MP1 doesn't turn on and leak. This may be overcome by level-shifting up the voltage of the enable signal EN_BST or removing the reconfigurability of the gate bootstrapping circuit altogether if it is not needed.

ADDITIONAL DESCRIPTION AND ASPECTS

Aspect 1 can include subject matter (such as a sampling circuit) comprising a switch circuit and a gate bootstrapping circuit. The switch circuit includes a switch input to receive an input voltage, a gate input, and a switch output. The gate bootstrapping circuit provides a boosted clock signal to the gate input of the switch circuit. The boosted voltage of the boosted clock signal tracks the input voltage by a voltage offset. The gate bootstrapping circuit includes a single boost capacitance coupled between a first circuit node and a second circuit node. A high supply voltage is applied to the first circuit node and the input voltage is applied the second circuit node to generate the boosted voltage on the single boost capacitance.

In Aspect 2, the subject matter of Aspect 1 optionally includes a gate bootstrapping circuit including a first transistor coupled to the high supply voltage and the first circuit node, wherein the boosted clock signal is also provided to a gate input of the first transistor to apply the high supply voltage to the single boost capacitance.

In Aspect 3, the subject matter of Aspect 2 optionally includes the first transistor being a p-type metal oxide semiconductor (PMOS) transistor and a transistor body of the first transistor is coupled to the first circuit node.

In Aspect 4, the subject matter of one or any combination of Aspects 1-3 optionally includes a first inverter and a second inverter comprising low voltage devices, wherein the first inverter is coupled between the high supply voltage and the second circuit node and is configured to receive an unboosted clock signal; and the second inverter is coupled between the first circuit node and the second circuit node and is configured to output the boosted clock signal.

In Aspect 5, the subject matter of one or any combination of Aspects 1-4 optionally includes a gate bootstrapping circuit including an enable input to receive an enable signal, and the gate bootstrapping circuit provides either the boosted clock signal or an unboosted clock signal to the gate input of the switch circuit according to the enable signal.

In Aspect 6, the subject matter of one or any combination of Aspect 5 optionally includes a gate bootstrapping circuit including a second transistor coupled to the high supply voltage and the first circuit node, wherein the second transistor includes a gate input coupled to the enable signal, and the second transistor provides the high supply voltage to the first circuit node according to the enable signal.

In Aspect 7, the subject matter of Aspect 6 optionally includes a third transistor coupled between the second circuit node and a low supply voltage, wherein the third transistor applies a low supply voltage to the second circuit node according to the enable signal and the unboosted clock signal.

In Aspect 8, the subject matter of one or any combination of Aspects 5-7 optionally includes a transmission gate circuit coupled to the input voltage and the second circuit node, wherein the transmission gate is configured to provide the input voltage to the second circuit node according to the enable signal and the unboosted clock signal.

In Aspect 9, the subject matter of one or any combination of Aspects 1-8 optionally includes an ADC circuit, wherein the output of the sampling circuit is applied to an input of the ADC circuit.

In Aspect 10, the subject matter of one or any combination of Aspects 1-9 optionally includes a switch circuit included in a switched capacitor circuit.

Aspect 11 includes subject matter (such as an analog-to-digital converter (ADC) circuit), or can optionally be combined with one or any combination of Aspects 1-10 to include such subject matter, comprising a sampling circuit, a digital-to-analog converted (DAC) circuit, a comparator circuit, and logic circuitry. The sampling circuit samples an input voltage to the ADC circuit and includes a switch circuit and a gate bootstrapping circuit. The switch circuit includes a switch input to receive an input voltage, a gate input, and a switch output. The gate bootstrapping circuit provides a boosted clock signal to the gate input of the switch circuit, and a boosted voltage of the boosted clock signal tracks the input voltage by a voltage offset. The gate bootstrapping circuit includes a single boost capacitance coupled between a first circuit node and a second circuit node, wherein a high supply voltage is applied to the first circuit node and the input voltage is applied the second circuit node to generate the boosted voltage on the single boost capacitance to provide the boosted clock signal. The DAC circuit is operatively coupled to the sampling circuit. The comparator circuit compares an output voltage of the DAC to a specified threshold voltage during a bit trial of the ADC circuit, and the logic circuitry performs bit trials of the ADC circuit.

In Aspect 12, the subject matter of Aspect 11 optionally includes a gate bootstrapping circuit including a first transistor coupled to the high supply voltage and the first circuit node, wherein the boosted clock signal is provided to a gate input of the first transistor to apply the high supply voltage to the single boost capacitance, and a transistor body of the first transistor is coupled to the first circuit node.

In Aspect 13, the subject matter of one or both of Aspects 11 and 12 optionally includes a gate bootstrapping circuit including a buffer circuit coupled between the first circuit node and the second circuit node, wherein the buffer circuit receives an unboosted clock signal and outputs a boosted clock signal, and wherein the buffer circuit includes a plurality of transistors that are low voltage devices.

In Aspect 14, the subject matter of one or any combination of Aspects 11-13 optionally includes a gate bootstrapping circuit including an enable input to receive an enable signal, and the gate bootstrapping circuit provides either the boosted clock signal or an unboosted clock signal to the gate input of the switch circuit according to the enable signal.

In Aspect 15, the subject matter of Aspect 14 optionally includes a gate bootstrapping circuit including a second transistor coupled to the high supply voltage and the first circuit node, wherein the second transistor includes a gate input coupled to the enable signal, and the second transistor provides the high supply voltage to the first circuit node according to the enable signal.

In Aspect 16, the subject matter of Aspect 15 optionally includes a third transistor coupled between the second circuit node and a low supply voltage, wherein the third transistor applies the low supply voltage to the second circuit node according to the enable signal and the unboosted clock signal.

In Aspect 17, the subject matter of one or any combination of Aspects 14-16 optionally includes a transmission gate circuit coupled to the input voltage and the second circuit node, wherein the transmission gate is configured to provide the input voltage to the second circuit node according to the enable signal and the unboosted clock signal.

In Aspect 18, the subject matter of one or any combination of Aspects 14-17 optionally includes the sampling circuit configured to operate in a boosted mode when the ADC circuit is configured to operate in a continuous mode and the enable signal is active, and operate in an unboosted mode when the ADC is configured to operate in an impulse mode and the enable signal is inactive.

Aspect 19 includes subject matter (such as an electronic circuit), or can optionally be combined with one or any combination of Aspects 1-18 to include such subject matter, comprising a switched capacitor circuit including an input to receive an input voltage, a gate input, and a switch output; and a gate bootstrapping circuit that provides a boosted clock signal to the gate input of the switched capacitor circuit that tracks the input voltage by a voltage offset. The gate bootstrapping circuit includes a single boost capacitance coupled between a first circuit node and a second circuit node, and includes a buffer circuit that receives an unboosted clock signal and outputs a boosted clock signal, wherein the buffer circuit is coupled between the first circuit node and the second circuit node and includes a plurality of transistors that are low voltage devices.

In Aspect 20, the subject matter of Aspect 19 optionally includes a gate bootstrapping circuit including a first transistor coupled to a high supply voltage and the first circuit node, wherein the boosted clock signal is provided to a gate input of the first transistor to apply the high supply voltage to the single boost capacitance.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A sampling circuit comprising:
a switch circuit including a switch input to receive an input voltage, a gate input, and a switch output; and
a gate bootstrapping circuit that provides a boosted clock signal to the gate input of the switch circuit, wherein a boosted voltage of the boosted clock signal tracks the input voltage by a voltage offset;
wherein the gate bootstrapping circuit includes:
a single boost capacitance coupled between a first circuit node and a second circuit node, wherein a high supply voltage is applied to the first circuit node and the input voltage is applied to the second circuit node to generate the boosted voltage on the single boost capacitance; and
an enable input to receive an enable signal, and the gate bootstrapping circuit provides either the boosted clock signal or an unboosted clock signal to the gate input of the switch circuit according to the enable signal.

2. The sampling circuit of claim 1, wherein the gate bootstrapping circuit includes a transistor coupled to the high supply voltage and the first circuit node, wherein the boosted clock signal is also provided to a gate input of the first transistor to apply the high supply voltage to the single boost capacitance.

3. The sampling circuit of claim 2, wherein the transistor is a p-type metal oxide semiconductor (PMOS) transistor and a transistor body of the first transistor is coupled to the first circuit node.

4. The sampling circuit of claim 1, including a first inverter and a second inverter comprising low voltage devices, wherein the first inverter is coupled between the high supply voltage and the second circuit node and is configured to receive an unboosted clock signal; and the second inverter is coupled between the first circuit node and the second circuit node and is configured to output the boosted clock signal.

5. The sampling circuit of claim 1, wherein the gate bootstrapping circuit includes a first transistor coupled to the high supply voltage and the first circuit node, wherein the transistor includes a gate input coupled to the enable signal, and the first transistor provides the high supply voltage to the first circuit node according to the enable signal.

6. The sampling circuit of claim 1, including a second transistor coupled between the second circuit node and a low supply voltage, wherein the second transistor applies a low supply voltage to the second circuit node according to the enable signal and the unboosted clock signal.

7. The sampling circuit of claim 1, including a transmission gate circuit coupled to the input voltage and the second circuit node, wherein the transmission gate is configured to provide the input voltage to the second circuit node according to the enable signal and the unboosted clock signal.

8. The sampling circuit of claim 1, including an ADC circuit, wherein the output of the sampling circuit is applied to an input of the ADC circuit.

9. The sampling circuit of claim 1, wherein the switch circuit is included in a switched capacitor circuit.

10. An analog-to-digital converter (ADC) circuit comprising:
a sampling circuit, configured to sample an input voltage to the ADC circuit, wherein the sampling circuit includes:
a switch circuit including a switch input to receive an input voltage, a gate input, and a switch output; and
a gate bootstrapping circuit that provides a boosted clock signal to the gate input of the switch circuit, wherein a boosted voltage of the boosted clock signal tracks the input voltage by a voltage offset, wherein the gate bootstrapping circuit includes a single boost capacitance coupled between a first circuit node and a second circuit node, wherein a high supply voltage is applied to the first circuit node and the input voltage is applied the second circuit node to generate the boosted voltage on the single boost capacitance to provide the boosted clock signal; and a buffer circuit coupled between the first circuit node and the second circuit node, wherein the buffer circuit receives an unboosted clock signal and outputs a boosted clock signal, and wherein the buffer circuit includes a plurality of transistors that are low voltage devices;
a digital-to-analog converter (DAC) circuit operatively coupled to the sampling circuit;
a comparator circuit configured to compare an output voltage of the DAC to a specified threshold voltage during a bit trial of the ADC circuit; and
logic circuitry configured to perform bit trials of the ADC circuit.

11. The ADC circuit of claim 10, wherein the gate bootstrapping circuit includes a transistor coupled to the high supply voltage and the first circuit node, wherein the boosted clock signal is provided to a gate input of the first transistor to apply the high supply voltage to the single boost capacitance, and a transistor body of the transistor is coupled to the first circuit node.

12. The ADC circuit of claim 10, wherein the gate bootstrapping circuit includes an enable input to receive an enable signal, and the gate bootstrapping circuit provides either the boosted clock signal or an unboosted clock signal to the gate input of the switch circuit according to the enable signal.

13. The ADC circuit of claim 12, wherein the gate bootstrapping circuit includes a first transistor coupled to the high supply voltage and the first circuit node, wherein the first transistor includes a gate input coupled to the enable signal, and the first transistor provides the high supply voltage to the first circuit node according to the enable signal.

14. The ADC circuit of claim 13, including a second transistor coupled between the second circuit node and a low supply voltage, wherein the second transistor applies the low supply voltage to the second circuit node according to the enable signal and the unboosted clock signal.

15. The ADC circuit of claim 12, including a transmission gate circuit coupled to the input voltage and the second circuit node, wherein the transmission gate is configured to provide the input voltage to the second circuit node according to the enable signal and the unboosted clock signal.

16. The ADC circuit of claim 12, wherein sampling circuit is configured to operate in a boosted mode when the ADC circuit is configured to operate in a continuous mode and the enable signal is active, and operate in an unboosted mode when the ADC is configured to operate in an impulse mode and the enable signal is inactive.

17. An electronic circuit comprising:
a switched capacitor circuit including an input to receive an input voltage, a gate input, and a switch output; and
a gate bootstrapping circuit that provides a boosted clock signal to the gate input of the switched capacitor circuit that tracks the input voltage by a voltage offset, wherein the gate bootstrapping circuit includes a single boost capacitance coupled between a first circuit node and a second circuit node, and includes a buffer circuit that receives an unboosted clock signal and outputs a boosted clock signal, wherein the buffer circuit is coupled between the first circuit node and the second circuit node and includes a plurality of transistors that are low voltage devices.

18. The electronic circuit of claim 17, wherein the gate bootstrapping circuit includes a transistor coupled to a high supply voltage and the first circuit node, wherein the boosted clock signal is provided to a gate input of the first transistor to apply the high supply voltage to the single boost capacitance.

* * * * *

UNITED STATES PATENT AND TRADEMARK OFFICE
CERTIFICATE OF CORRECTION

PATENT NO. : 10,547,308 B2
APPLICATION NO. : 16/166858
DATED : January 28, 2020
INVENTOR(S) : Junhua Shen Page 1 of 1

It is certified that error appears in the above-identified patent and that said Letters Patent is hereby corrected as shown below:

In the Claims

In Column 9, Line 44, in Claim 10, after "applied", insert --to--

Signed and Sealed this
First Day of September, 2020

Andrei Iancu
*Director of the United States Patent and Trademark Office*